US011090904B2

(12) United States Patent
Wang et al.

(10) Patent No.: US 11,090,904 B2
(45) Date of Patent: Aug. 17, 2021

(54) STRETCHABLE FILM, FABRICATING METHOD THEREOF, AND DISPLAY DEVICE INCLUDING THE SAME

(71) Applicant: BOE TECHNOLOGY GROUP CO., LTD., Beijing (CN)

(72) Inventors: Pinfan Wang, Beijing (CN); Hejin Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 83 days.

(21) Appl. No.: 16/399,075

(22) Filed: Apr. 30, 2019

(65) Prior Publication Data

US 2020/0031095 A1 Jan. 30, 2020

(30) Foreign Application Priority Data

Jul. 24, 2018 (CN) .......................... 201810821314.6

(51) Int. Cl.
*B32B 3/02* (2006.01)
*B32B 7/035* (2019.01)
(Continued)

(52) U.S. Cl.
CPC ............... *B32B 7/035* (2019.01); *B32B 3/02* (2013.01); *B32B 7/02* (2013.01); *B32B 27/08* (2013.01); *B32B 27/283* (2013.01); *B32B 27/308* (2013.01); *B32B 27/365* (2013.01); *B32B 38/0036* (2013.01); *G09F 9/301* (2013.01); *B32B 2038/0076* (2013.01); *B32B 2305/72* (2013.01); *B32B 2307/51* (2013.01); *B32B 2310/0831* (2013.01); *B32B 2333/12* (2013.01); *B32B 2369/00* (2013.01);
(Continued)

(58) Field of Classification Search
CPC ...................................................... G09F 9/301
See application file for complete search history.

(56) References Cited

U.S. PATENT DOCUMENTS 9,619,059 B2   4/2017   Park et al.
2016/0224068 A1  8/2016   Choi et al.
(Continued)

FOREIGN PATENT DOCUMENTS

| CN | 102969320 | 3/2013 |
| CN | 104576959 | 4/2015 |
| CN | 105843437 | 8/2016 |

OTHER PUBLICATIONS

1st Office Action dated Apr. 21, 2020 for Chinese Patent Application No. 201810821314.6.

*Primary Examiner* — William P Watkins, III
(74) *Attorney, Agent, or Firm* — Thomas | Horstemeyer, LLP

(57) ABSTRACT

The present disclosure provides a stretchable film and a fabricating method thereof, and a display device including the same. The stretchable film is composed of at least two layers, where each layer includes a first portion and a plurality of second portions. The first portion is a grid-like structure having a plurality of openings, and the second portion is an island-like structure in the opening. Any one of the plurality of second portions in any one layer does not completely overlap with any one of the plurality of second portions in other layers. The first portions of adjacent layers are partially overlapped, and the overlapped portions are adhered together. The first portion has an elasticity modulus that is less than an elasticity modulus of the second portion.

20 Claims, 8 Drawing Sheets

(51) Int. Cl.
*B32B 7/02* (2019.01)
*B32B 27/08* (2006.01)
*B32B 27/28* (2006.01)
*B32B 27/30* (2006.01)
*B32B 27/36* (2006.01)
*B32B 38/00* (2006.01)
*G09F 9/30* (2006.01)

(52) U.S. Cl.
CPC ..... *B32B 2383/00* (2013.01); *B32B 2457/202* (2013.01); *B32B 2457/206* (2013.01)

(56) References Cited

U.S. PATENT DOCUMENTS

2016/0320803 A1 11/2016 Oh et al.
2017/0196101 A1 7/2017 Ki et al.

STRETCHABLE FILM, FABRICATING METHOD THEREOF, AND DISPLAY DEVICE INCLUDING THE SAME

CROSS-REFERENCE TO RELATED APPLICATIONS

The present application is based on, and claims the benefit of and priority to, Chinese Patent Application No. 201810821314.6 filed on Jul. 24, 2018, the entire contents of which being incorporated herein by reference.

TECHNICAL FIELD

The present disclosure relates to the field of display technology, and in particular, to a stretchable film, a fabricating method thereof, and a display device including the same.

BACKGROUND

Recently, flexible display devices having stretchable and/or extendable properties have been studied in the field. The flexible display device includes, for example, an organic light emitting display (OLED) device or a liquid crystal display (LCD) device.

For example, an element or a component of the display device may be formed on a flexible resin substrate to obtain a flexible display device. However, when the display device is attached to a surface having a variable curvature, sufficient flexibility and/or wear resistance characteristics cannot be achieved only using a flexible resin substrate.

The existing stretchable film is formed by adhering a plurality of hard coating sheets to a flexible substrate, wherein the hard coating sheets are discontinuous, thus, resulting in a complicated fabricating process of the stretchable film. In particular, as the size of the coating sheet becomes smaller, the complexity of the fabricating process is increased by order of magnitudes.

SUMMARY

According to an aspect of the present disclosure, the present disclosure provides a stretchable film composed of at least two layers, wherein each layer includes a first portion and a plurality of second portions, the first portion being a grid-like structure having a plurality of openings, the second portion being an island-like structure in the opening; any one of the plurality of second portions in any one layer is not completely overlapped with any one of the plurality of second portions in the other layer; the first portions of adjacent layers are partially overlapped, and the overlapped portions are adhered together; the first portion has an elasticity modulus that is less than an elasticity modulus of the second portion.

According to an embodiment of the present disclosure, the first portion includes at least one of polycarbonate, polymethyl methacrylate, and organic silicone which are uncrosslinked and uncured; the plurality of second portions includes at least one of polycarbonate, polymethyl methacrylate, and organic silicone which are crosslinked and cured through ultraviolet light irradiation.

According to an embodiment of the present disclosure, the stretchable film includes a portion in which the first portions of all layers are commonly overlapped, and a maximum width of the portion in which the first portions are commonly overlapped does not exceed 300 μm.

According to an embodiment of the present disclosure, an orthographic projection of the plurality of second portions of all layers of the stretchable film on the stretchable film completely covers the stretchable film.

According to another embodiment of the present disclosure, an area of the overlapped portion of the first portions of adjacent two layers in the stretchable film is not less than 10% of a total area of the stretchable film.

According to another embodiment of the present disclosure, a diagonal of a pattern of each of the plurality of second portions has a size from about 10 μm to about 1000 μm.

According to another embodiment of the present disclosure, each of the plurality of second portions has at least one pattern of a polygon, circle, and ellipse.

According to another embodiment of the present disclosure, the plurality of second portions have a rigidity that is greater than 1 Gpa, and the first portion has a rigidity from about 0.01 Gpa to about 1 Gpa.

According to another embodiment of the present disclosure, a deformation of the plurality of second portions is less than 10% of a deformation of the first portion.

According to another embodiment of the present disclosure, the stretchable film is composed of 2-4 layers.

According to another embodiment of the present disclosure, the stretchable film has a thickness from about 6 μm to about 120 μm.

According to another aspect of the present disclosure, a display device is provided including: a flexible substrate, a display unit, and a stretchable film in the above embodiments. The display unit is disposed on the flexible substrate. The stretchable film is attached to the display unit. The stretchable film is composed of at least two layers, wherein each layer includes a first portion and a plurality of second portions, the first portion is a grid-like structure having a plurality of openings, and the second portion is an island-like structure in the opening; the second portion in any one layer is not completely overlapped with the second portion in the other layer; the first portions of adjacent layers are partially overlapped, and the overlapped portions are adhered together; the first portion has an elasticity modulus that is less than an elasticity modulus of the second portion.

According to another aspect of the present disclosure, there is provided a fabricating method of a stretchable film including: forming a coating with a dispersion system containing a polymer crosslinked and cured by ultraviolet light; applying ultraviolet light irradiation to a predetermined area on the coating with a predetermined pattern and heat-treating the coating to form a plurality of second portions, wherein a region which is not irradiated by ultraviolet light forms a first portion; repeating the fabricating method mentioned above at least once, wherein each layer includes a first portion and a plurality of second portions, the first portion being a grid-like structure having a plurality of openings, the second portion being an island-like structure in the opening; any one of the plurality of second portions in any one layer does not completely overlap with any one of the plurality of second portions in the other layer; the first portions of adjacent layers are partially overlapped, and the overlapped portions are adhered together; the first portion has an elasticity modulus that is less than an elasticity modulus of the second portion.

According to an embodiment of the present disclosure, applying ultraviolet light irradiation to a predetermined area on the coating with a predetermined pattern and heat-treating the coating is specifically as follows: applying ultraviolet light irradiation to the predetermined area with the predetermined pattern, and then heat-treating the coating to remove a solvent, so as to form the plurality of second portions.

According to an embodiment of the present disclosure, applying ultraviolet light irradiation to a predetermined area on the coating with a predetermined pattern and heat-treating the coating is specifically as follows: applying ultraviolet light irradiation to the predetermined area with the predetermined pattern and, at the same time, heat-treating the coating to remove a solvent, so as to form the plurality of second portions.

According to an embodiment of the present disclosure, the polymer crosslinked and cured by ultraviolet light is one or more of polycarbonate and polymethyl methacrylate.

According to another embodiment of the present disclosure, the predetermined pattern is at least one pattern of a polygon, circle, and ellipse.

BRIEF DESCRIPTION OF THE DRAWINGS

The above and other features and advantages of the present disclosure will become more apparent from the detailed description of the example embodiments.

DETAILED DESCRIPTION

Figure 1:
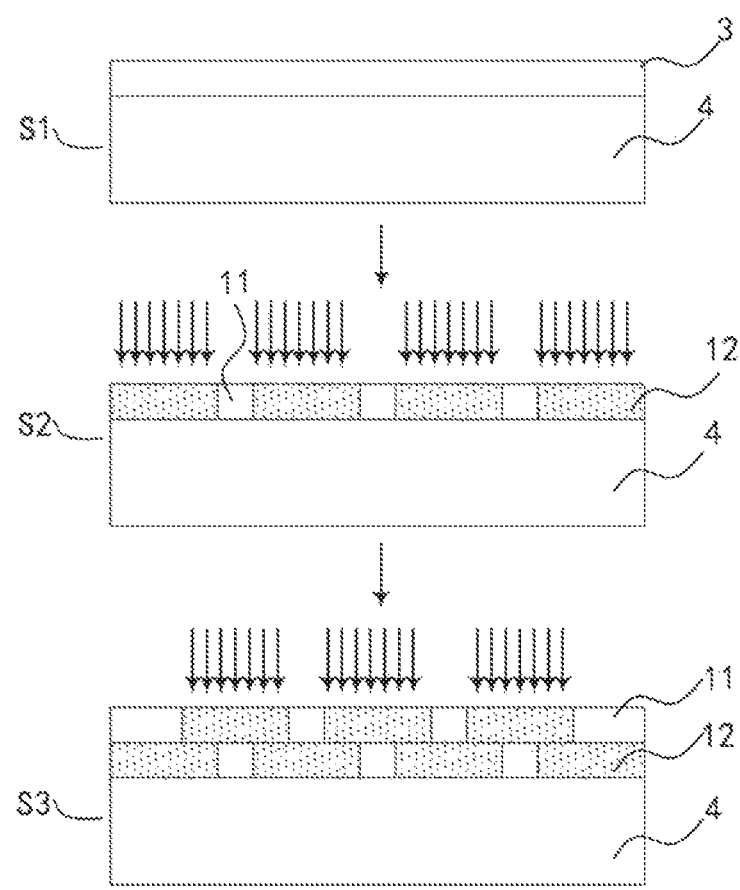
FIG. 1 is a flow chart of a fabricating method of a stretchable film according to an embodiment of the present disclosure.

Example embodiments will now be described more fully with reference to the accompanying drawings. However, the example embodiments can be embodied in a variety of forms, and should not be construed as being limited to the embodiments set forth herein; rather, these embodiments are provided so that this disclosure will be thorough and complete, and the concepts of the example embodiments will be fully given to those skilled in the art. In the drawings, dimensions of layers and regions may be exaggerated for clarity of illustration. The same reference numerals in the drawings denote the same or similar structures, and thus their detailed descriptions will be omitted.

It should be noted that the terms upper and lower in the present disclosure are merely relative concepts or are based on the normal use state of the product, and should not be considered as limiting.

The stretchable film of an embodiment of the present disclosure is composed of at least two layers, wherein each layer includes a first portion and a plurality of second portions. The first portion is a grid-like structure having a plurality of openings, and the second portion is an island-like structure in the opening, i.e., the plurality of second portions are dispersed in the first portion. The second portions in any one layer do not completely overlap with the second portions in the other layer, and the overlapped portions of the second portions in the adjacent layers are separated from each other. The first portions in the adjacent layers are partially overlapped, and the overlapped portions are adhered together. Portions, in which the second portions and the first portion are overlapped, in adjacent layers are separated from each other, and an elastic modulus of the first portion is smaller than an elastic modulus of the second portion. The stretchable film of the present disclosure may be fabricated by the following steps: S1, forming a coating with a dispersion system containing a polymer crosslinked and cured by ultraviolet light; S2, applying ultraviolet light irradiation to a predetermined area on the coating with a predetermined pattern and heat-treating the coating to form a plurality of second portions, wherein a region which is not irradiated by ultraviolet light forms a first portion; and repeating sequentially the steps S1 and S2 at least once.

FIG. 1 shows a process of forming a stretchable film according to an embodiment of the present disclosure. As shown in FIG. 1, the step S1 is first performed to form a coating 3 on the substrate 4. The coating 3 is formed of a dispersion system containing a polymer crosslinked and cured by ultraviolet light. The polymer which may be crosslinked and cured by ultraviolet light may be any high-molecular compound which may be crosslinked and cured by ultraviolet light irradiation, such as polycarbonate, polymethyl methacrylate, organic silicone, or the like. The polymer which may be crosslinked and cured by ultraviolet light may be dissolved in an organic solvent to form a dispersion system. The viscosity of the dispersion system is generally between about 100 cps and about 10,000 cps. The dispersion system may be coated on the substrate 4 by wet coating, such as slit coating, spin coating, or the like to form the coating 3.

Then, the step S2 is performed to apply ultraviolet light irradiation to the predetermined region with a predetermined pattern, wherein a region irradiated by ultraviolet light forms a plurality of second portions 12. Under the irradiation of ultraviolet light, the high-molecular compound in the irradiated region of the coating 3 is subjected to a crosslinking reaction to be cured to form the second portion 12. In one embodiment, ultraviolet light of 365 nm is selected, and its irradiation amount is preferably about 50 mJ/cm$^2$ to about 1,000 mJ/cm$^2$, and its irradiation time may be specifically determined according to the type of the high-molecular material to be specifically used and the irradiation amount. In a specific implementation, an average UV measurement of sunlight is 100 mW/m$^2$, and a curing condition of the material is: 365 nm ultraviolet light for a dose of 300*20=100 mW*min/m2, and is irradiated for 1000 min at noon and the temperature is greater than 100° C. The calculation above is based on the standard method for calculating the UV index recommended by the World Meteorological Organization and the World Health Organization: measuring the intensity of the solar ultraviolet light at different wavelengths up to 400 nm, multiplying the intensity of the solar ultraviolet light with different wavelengths by a corresponding weighted value in the "red spot spectrum", adding the above results to obtain the total UV intensity weighted by the red spot spectrum in a unit of mW/m$^2$, and then multiplying the total UV intensity weighted by the red spot spectrum by 0.04 to obtain the UV index (UV index per unit is 25 mW/m$^2$). For example, if the average amount of radiation of the strongest noon sunshine reaching the ground within 15 minutes is 100 mW/m$^2$, it is converted to an ultraviolet index of 4.

The predetermined pattern may be a polygon, a circle, an ellipse, or the like. After the irradiation of the predetermined pattern, the formed second portion 12 has a predetermined pattern, such as a polygon, a circle, an ellipse, or the like.

After the ultraviolet light irradiation, the coating 3 is subjected to heat treatment to remove the solvent, and the region without irradiated by ultraviolet light forms the first portion 11. The heating temperature may be 100-200° C., and the treatment time is 10-60 minutes. The organic solvent in the coating 3 is removed, and the region without irradiated by ultraviolet light (i.e., the first portion 11) is in a semi-cured state (with a viscosity greater than 10,000 cps).

In another embodiment, the predetermined area may be irradiated by ultraviolet light with a predetermined pattern while the coating 3 is subjected to heat treatment to remove the solvent, so as to form a plurality of the second portions 12.

Thereafter, the S1-S2 steps are repeated a predetermined number of times in accordance with the predetermined number of layers of the stretchable film. For example, if the stretchable film has 2 layers, the S1-S2 steps are repeated once; the stretchable film has 3 layers, the S1-S2 steps are repeated 2 times; the stretchable film has 4 layers, the S1-S2 steps are repeated 3 times, and so on.

When a second layer of coating is formed, a region in which the second layer of coating is irradiated by ultraviolet light does not completely overlap with the second portion 12 of a first layer of coating, i.e., the second portions 12 of the first the second layers of coating are completely overlapped. Since the second portion 12 in the first layer is completely cured, the portions in which the second portions 12 of first and second layers are overlapped are in contact with each other, but cannot be adhered together. The portions in which the second portion 12 and the first portion 11 of first and second layers are overlapped cannot be adhered together. The first portion 11 of the first layer has been semi-cured such that the fluidity is limited and the crosslinking reaction cannot occur, therefore, when the second layer is subjected to ultraviolet light irradiation, the first portion 11 will not be cured if the region of the second layer irradiated by ultraviolet light corresponds to the first portion 11 of the first layer. When the first portion 11 of the second layer corresponds to the first portion 11 of the first layer, the first portion 11 of the first layer is in a semi-cured state, so that the organic solvent in the coating partially dissolves the first portion 11 of the first layer when the second layer is coated, and is removed when the second layer of coating is heat treated. Thus, the portions in which the first portion 11 in the first layer and the first portion 11 in the second layer are overlapped can be adhered together. If the stretchable film has two or more layers, a corresponding relationship between the second portion and the first portion of other adjacent layers is the same as a corresponding relationship between the first portion 11 of the first layer and the second portion 12 of the second layer. Therefore, portions of the stretchable film in which the second portions of adjacent layers are overlapped are separated from each other. The first portions of adjacent layers are partially overlapped, and the overlapped portions are adhered together. Portion in which the second portion and the first portion of adjacent layers are overlapped are separated from each other.

The stretchable film includes a portion in which the first portions of all layers are commonly overlapped, i.e., an orthographic projection of the second portions 12 of all layers of the stretchable film on the stretchable film does not completely cover an orthographic projection of the first portions 11 of all layers on the stretchable film, and a maximum width W of the overlapped portion of the first portion does not exceed 300 μm, and in one embodiment, does not exceed 50 μm. In another embodiment, the stretchable film does not include a portion in which all of the first portions of all layers are overlapped. That is to say, the orthographic projection of the second portion of the stretchable film on the stretchable film completely covers the stretchable film. Since the stretchable film in the present disclosure is attached to the display unit of the display device to protect the display unit, a stylus is directly in contact with the stretchable film when it is operated on the display unit. When there is a portion in which the first portions of all layers in the stretchable film are commonly overlapped, since the first portion is softer relative to the second portion, a slight depression may occur when the stylus is in contact with the overlapped portion of the first portions, which has an adverse effect on the flexibility of the stylus operation and also affects the aesthetics of the display unit. In order to prevent these problems, in the present application, the maximum width W of the overlapped portion of the first portions is set to be not more than 300 μm, or there is no portion in which the first portions of all layers are overlapped in the stretchable film, i.e., the orthographic projection of the second portion of the stretchable film on the stretchable film may completely cover the stretchable film.

In order to increase adhesion of the layers, in one embodiment, an area of the overlapped portion of the first portions of adjacent two layers in the stretchable film is not less than 10% of a total area of the stretchable film.

A diagonal of a pattern of each of the plurality of second portions has a size from about 10 μm to about 1000 μm for the purpose of protecting pixels. In one embodiment, the diagonal of the pattern of the second portion has a size from about 50 μm to about 1000 μm. The size of the second part in the present disclosure refers to the shortest distance of the diagonal in the pattern of the second portion, such as a size of a diagonal of a rectangle, the shortest size of a diagonal of a polygon, a size of a minor axis of an ellipse, and a size of a diameter of a circle.

The elasticity modulus of the second portion 12 in the stretchable film is greater than the elasticity modulus of the first portion 11. In one embodiment, the rigidity of the second portion 12 is greater than 1 GPa and the rigidity of the first portion 11 is between about 0.01 and about 1 Gpa. In addition, the deformation of the second portion is less than 10% of the deformation of the first portion.

The stretchable film may be any suitable number of layers, and in one embodiment, the number of layers of the stretchable film is from 2 to 4.

The stretchable film has a thickness from about 6 to about 120 μm.

Figure 2A:
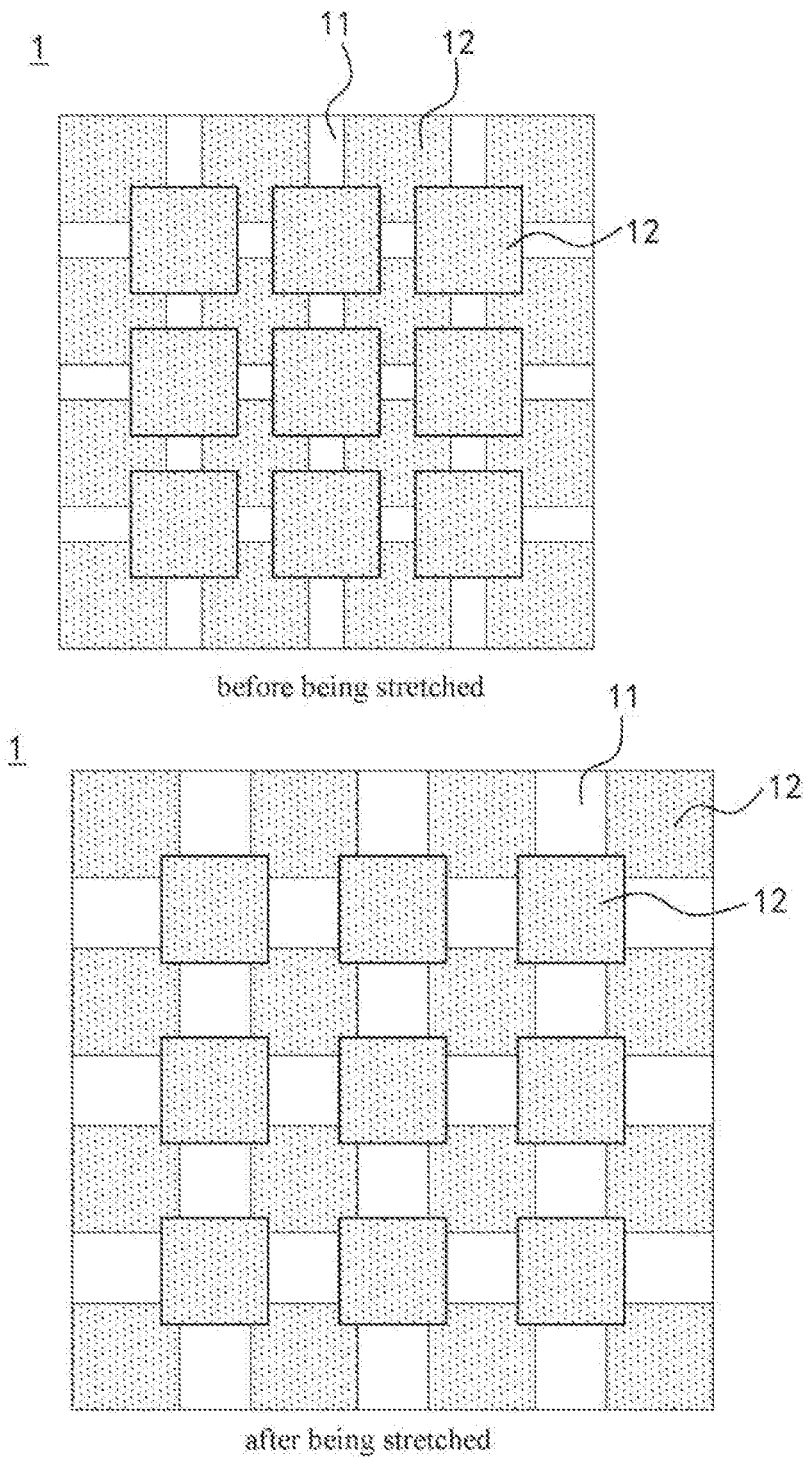
FIG. 2A is a schematic view of a two-layer structured stretchable film before and after stretched.
Figure 2B:
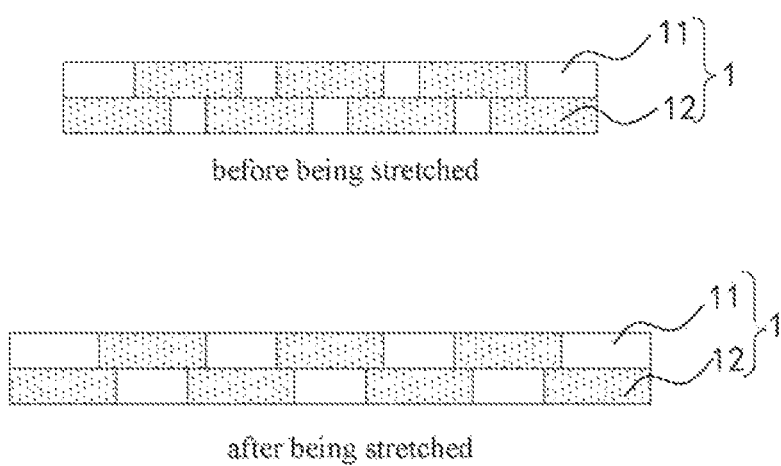
FIG. 2B is a schematic cross-sectional view of the two-layer structured stretchable film of FIG. 2A before and after stretched.

FIG. 2A is a schematic view of a two-layer structured stretchable film before and after stretched, and FIG. 2B shows a cross-sectional schematic view taken along line A-A of the two-layer structured stretchable film 1 of FIG. 2A before being stretched and a cross-sectional schematic view taken along line B-B of the two-layer structured stretchable film 1 of FIG. 2A after being stretched, respectively. The second portions 12 of the two-layer structure are partially overlapped before being stretched. After being stretched, while the area of the first portion 11 increases under an external force, the area covered by the second portion 12 does not change. The area of the overlapped portion of the second portions 12 in the two layers becomes smaller, and the coverage area of the entire second portion 12 increases. The second portion 12 of the stretchable film functions to protect the pixels, and the first portion 11 provides deformation.

Figure 3A:
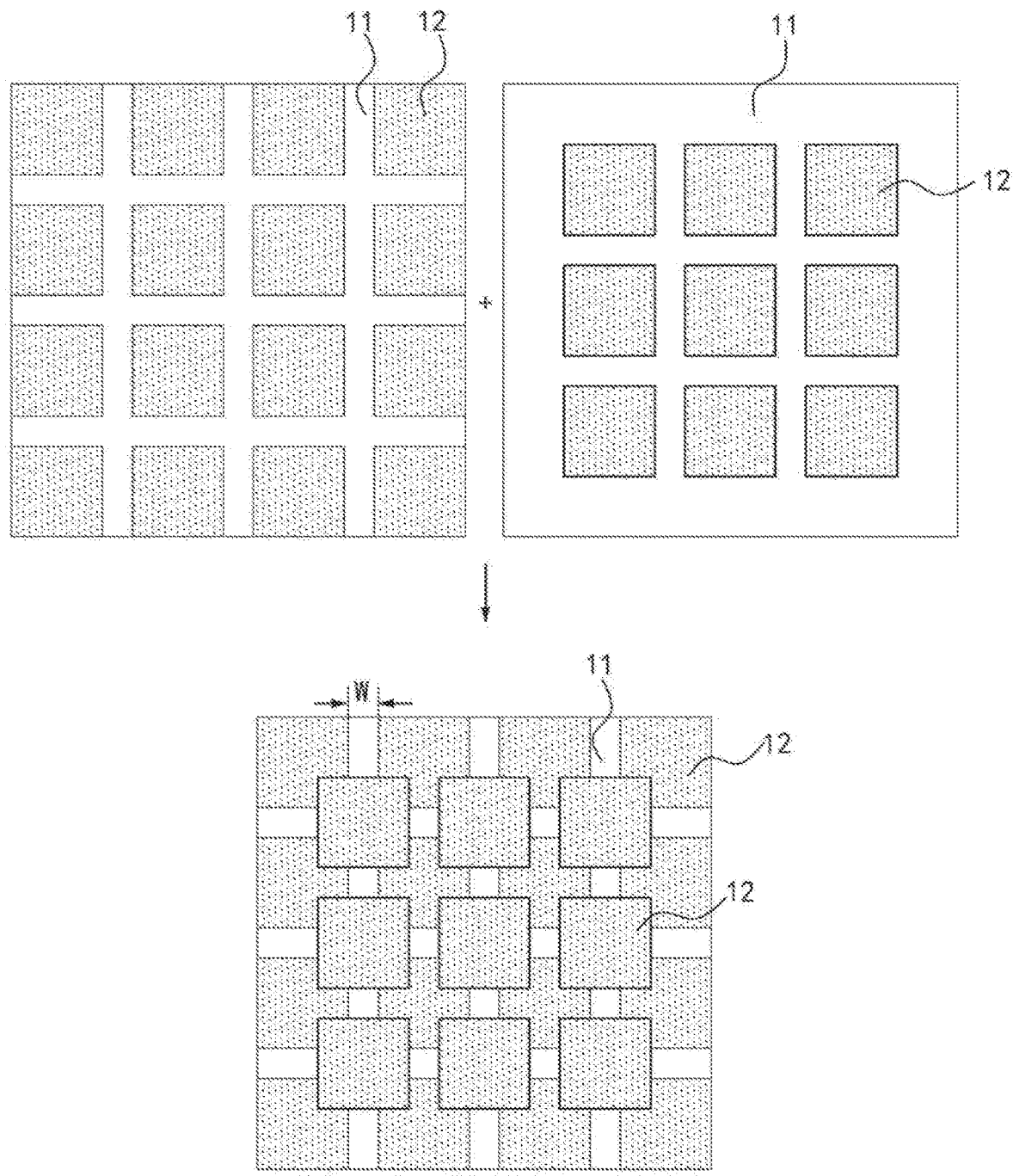
FIGS. 3A, 3B, and 3C are stacked schematic views of a four-layer structured stretchable film.
Figure 3B:
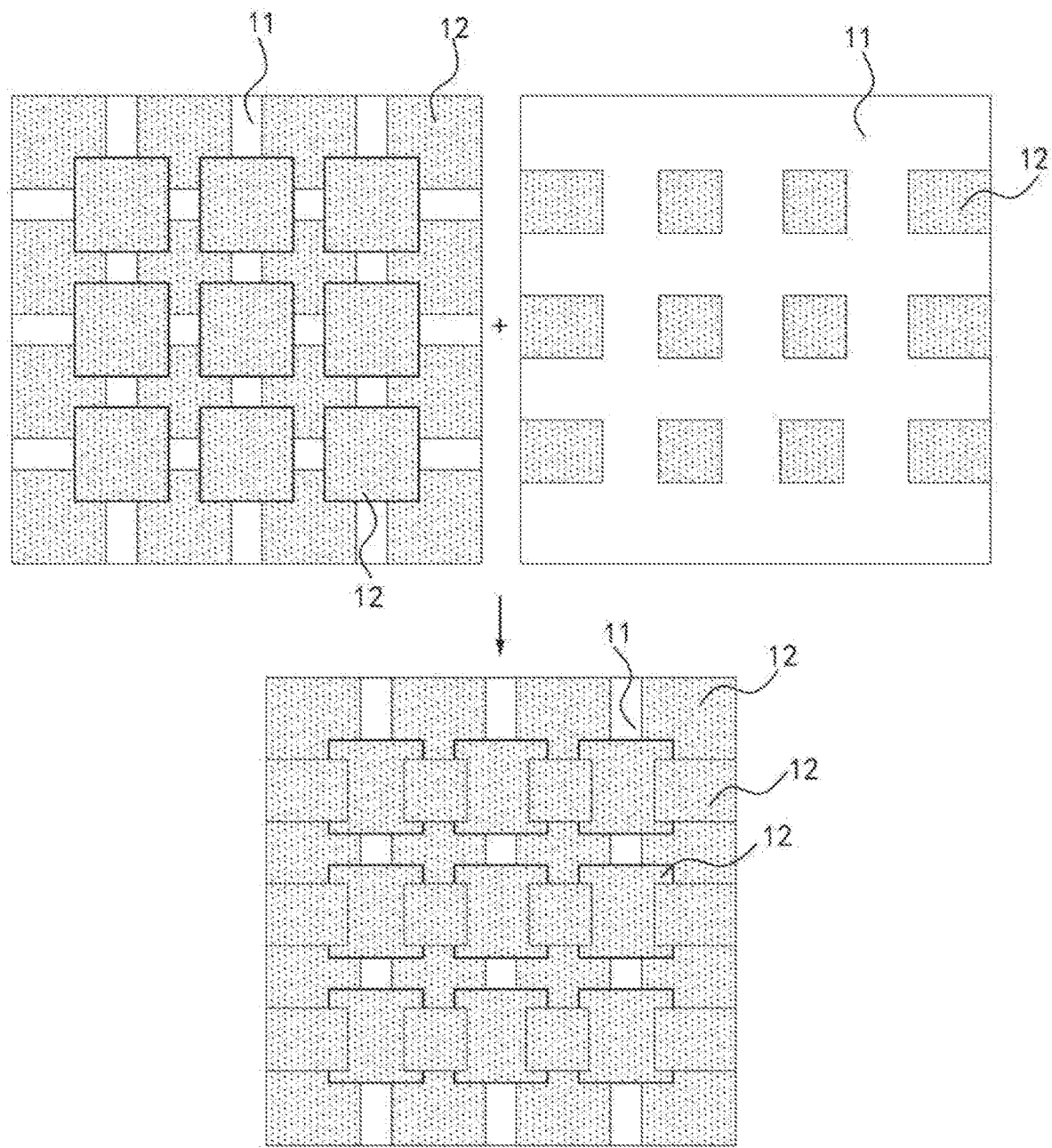
Figure 3C:
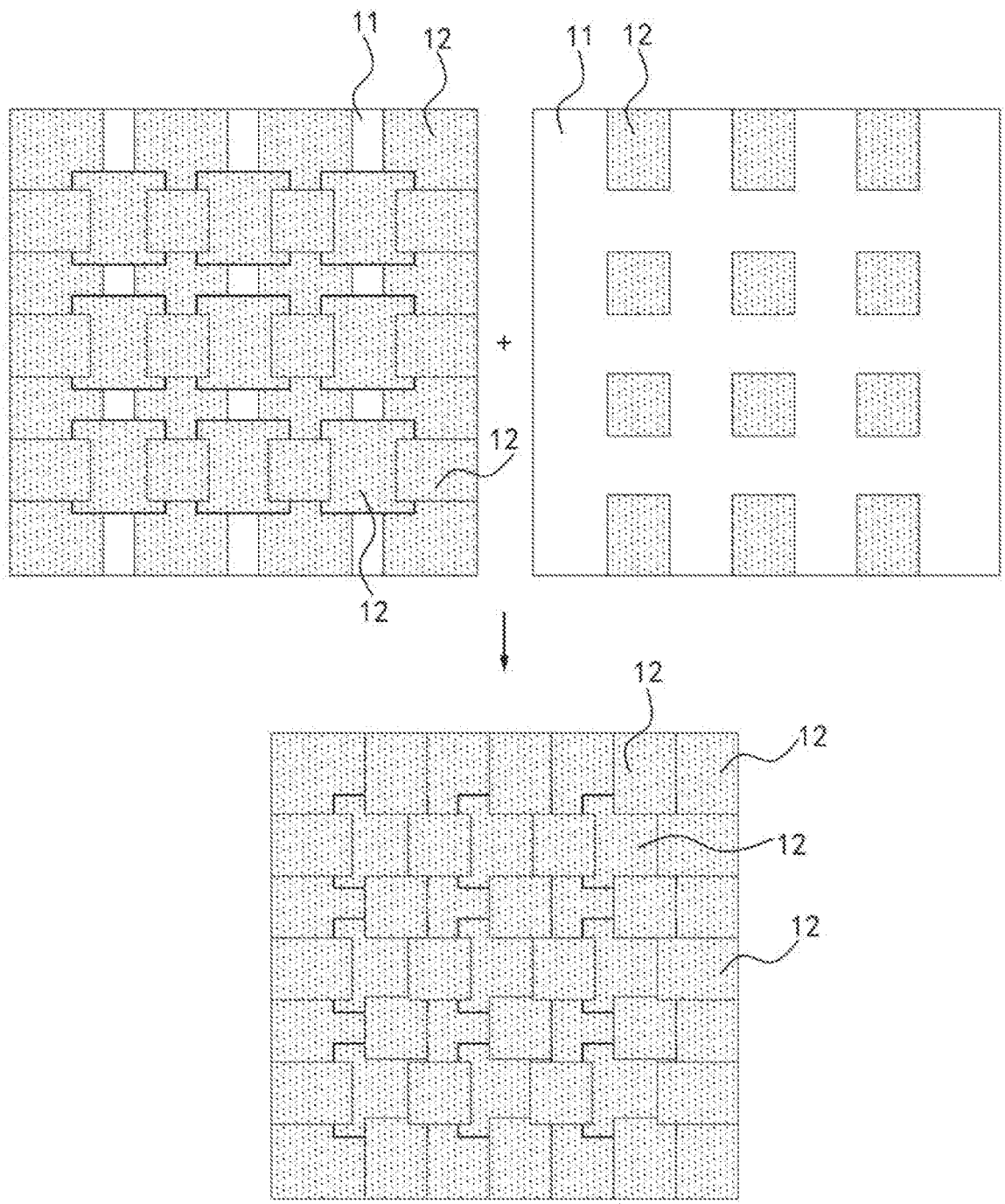
Figure 3D:
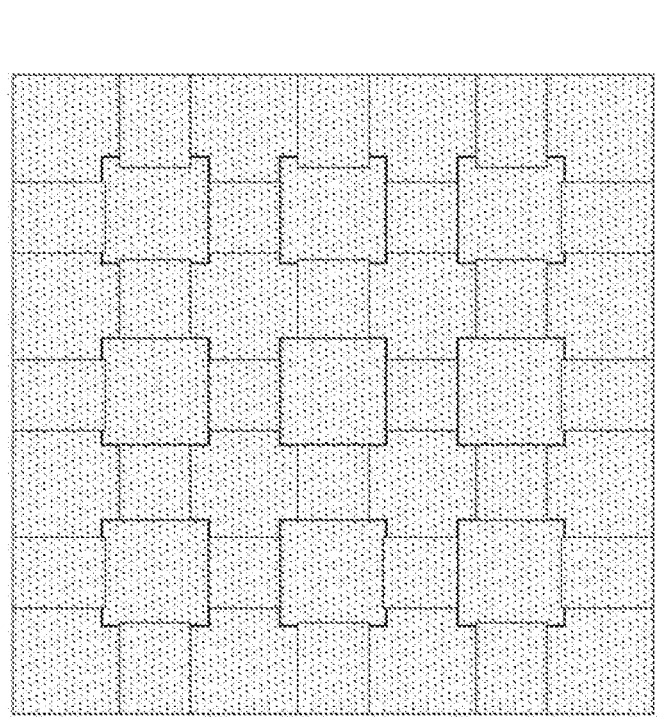
FIG. 3D is a schematic view showing a four-layer structured stretchable film which is in a stretched state.
Figure 4:
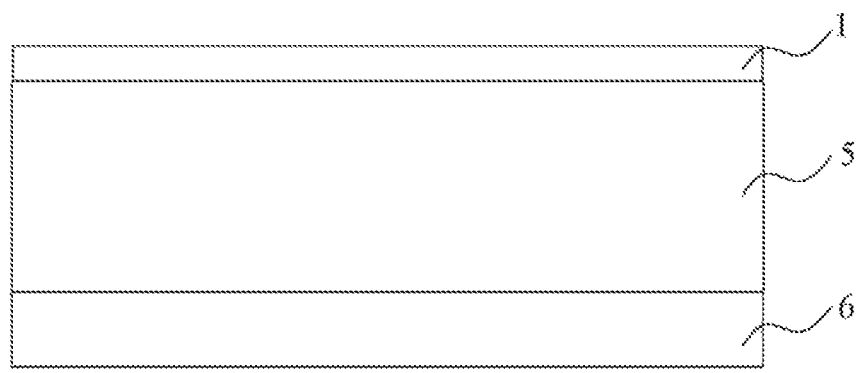
FIG. 4 is a schematic structural view of a display device according to an embodiment of the present disclosure.

FIGS. 3A to 3C show stacked schematic views of a four-layer structured stretchable film 1. FIGS. 3A to 3C do not refer to a process of forming a four-layer structured stretchable film, instead, merely show the arrangement of the second portion 12 and the first portion 11 in the structure of each layer of the stretchable film having a four-layer structure, and the arrangement relationship between the second portion 12 and the first portion 11 of each layer and the second portion 12 and the first portion 11 of other layers after being stacked. FIG. 3A shows the arrangement of the second portion 12 of the first layer and the first portion 11 of the second layer, and the arrangement of the second portion 12 of the first layer and the first portion 11 of the second layer after the stacking of the first layer and the second layer. FIG. 3B shows the arrangement of the second portion 12 and the first portion 11 in the third layer, and the structure after stacked with the first layer and the second layer. FIG. 3C shows the arrangement of the second portion 12 and the first portion 11 in the fourth layer, and the structure after stacked with first to third layers. As can be seen from FIG. 3C, after stacking of four layers, all of the second portions 12 of the four layers completely cover the stretchable film. FIG. 3D shows a schematic view of the stretchable film of the four-layer stacked structure after being stretched. As can be seen from the figure, after being stretched, all of the second portions 12 still completely cover the stretchable film.

The stretchable film of the present disclosure is composed of a multilayer structure in which each layer includes a second portion 12 and a first portion 11, and the second portion 12 and the first portion 11 may be formed from the same raw material by different processes to form different regions of elasticity modulus, thereby simplifying the process and reducing costs.

The present disclosure also provides a display device including a flexible substrate 6, a display unit 5, and the stretchable film 1 in the above embodiment. The display unit 5 is disposed on the flexible substrate 6. The stretchable film 1 is attached to the display unit 5. In an embodiment, the stretchable film 1 may be attached to the display unit 5 by an adhesive. In another embodiment, the stretchable film 1 may also be fabricated by applying a coating on the display unit 5 during the fabrication process. Those skilled in the art can obtain the structures of the display unit 5 and the flexible substrate 6 and the connecting manner therebetween in the related art, which will not be repeated herein.

Of course, the present disclosure may include various other embodiments, and various corresponding changes and modifications may be made by those skilled in the art without departing from the spirit and scope of the present disclosure. However, these changes and modifications are intended to be included within the scope of the appended claims.

What is claimed is:

1. A stretchable film, comprising:
at least two layers, each layer of the at least two layers comprising a first portion and a plurality of second portions, the first portion being a grid-like structure having a plurality of openings, the plurality of second portions being an island-like structure in the opening, wherein:
any one of the plurality of second portions in any one layer is not completely overlapped with any one of the plurality of second portions in the other layer;
the first portion of adjacent layers are partially overlapped, and the overlapped portions are adhered together;
the first portion has an elasticity modulus that is less than an elasticity modulus of the plurality of second portions; and
materials of the first portion and the second portions are a same polymer, the polymer of the first portion is not crosslinked and cured, and the polymer of the second portions are crosslinked and cured by ultraviolet light irradiation.

2. The stretchable film according to claim 1, wherein:
the first portion comprises at least one of polycarbonate, polymethyl methacrylate, and organic silicone which are uncrosslinked and uncured; and
the plurality of second portions comprises at least one of polycarbonate, polymethyl methacrylate and organic silicone which are crosslinked and cured through ultraviolet light irradiation.

3. The stretchable film according to claim 1, wherein:
the stretchable film comprises a portion in which the first portion of all layers are commonly overlapped; and
a maximum width of the portion in which the first portion are commonly overlapped does not exceed 300 μm.

4. The stretchable film according to claim 1, wherein an orthographic projection of the plurality of second portions of all layers of the stretchable film on the stretchable film completely covers the stretchable film.

5. The stretchable film according to claim 1, wherein an area of the overlapped portion of the first portion of adjacent two layers in the stretchable film is not less than 10% of a total area of the stretchable film.

6. The stretchable film according to claim 1, wherein a diagonal of a pattern of each of the plurality of second portions has a size from about 10 μm to about 1000 μm.

7. The stretchable film according to claim 1, wherein each of the plurality of second portions has at least one pattern of a polygon, a circle, and an ellipse.

8. The stretchable film according to claim 1, wherein the plurality of second portions have a rigidity that is greater than 1 Gpa, and the first portion has a rigidity from about 0.01 Gpa to about 1 Gpa.

9. The stretchable film according to claim 1, wherein a deformation of the plurality of second portions is less than 10% of a deformation of the first portion.

10. The stretchable film according to claim 1, wherein the stretchable film is composed of 2-4 layers.

11. The stretchable film according to claim 1, wherein the stretchable film has a thickness from about 6 μm to about 120 μm.

12. A display device, comprising:
a flexible substrate;
a display unit disposed on the flexible substrate;
a stretchable film attached to the display unit, wherein:
the stretchable film is composed of at least two layers;
each layer of the at least two layers comprises a first portion and a plurality of second portions, the first portion being a grid-like structure having a plurality of openings, and the plurality of second portions being an island-like structure in the opening;
the plurality of second portions in any one layer is not completely overlapped with the plurality of second portions in the other layer; the first portion of adjacent layers are partially overlapped, and the overlapped portions are adhered together;
the first portion has an elasticity modulus that is less than an elasticity modulus of the plurality of second portions; and
materials of the first portion and the second portions are a same polymer, the polymer of the first portion is not crosslinked and cured, and the polymer of the second portions are crosslinked and cured by ultraviolet light irradiation.

13. The display device according to claim 12, wherein the stretchable film comprises an overlapped portion of the first portion of all layers, and a maximum width of the overlapped portion of the first portion does not exceed 300 μm.

14. The display device according to claim 12, wherein an orthographic projection of the plurality of second portions of all layers of the stretchable film on the stretchable film completely covers the stretchable film.

15. The display device according to claim 12, wherein an area of the overlapped portion of the first portion of adjacent two layers in the stretchable film is not less than 10% of a total area of the stretchable film.

16. A method of fabricating a stretchable film, comprising:
    forming a coating with a dispersion system containing a polymer crosslinked and cured by ultraviolet light;
    applying ultraviolet light irradiation to a predetermined area on the coating with a predetermined pattern;
    heat-treating the coating to form a plurality of second portions, wherein a region which is not irradiated by the ultraviolet light forms a first portion; and
    repeating the forming of the coating, the applying of the ultraviolet light irradiation, and the heat-treating of the coating at least once, wherein:
        each layer comprises the first portion and the plurality of second portions, the first portion being a grid-like structure having a plurality of openings, the plurality of second portions being an island-like structure in the openings;
        any one of the plurality of second portions in any one layer is not completely overlapped with any one of the plurality of second portions in the other layer;
        the first portion of adjacent layers are partially overlapped, and the overlapped portions are adhered together;
        the first portion has an elasticity modulus that is less than an elasticity modulus of the plurality of second portions; and
        materials of the first portion and the second portions are a same polymer, the polymer of the first portion is not crosslinked and cured, and the polymer of the second portions are crosslinked and cured by ultraviolet light irradiation.

17. The method according to claim 16, wherein applying ultraviolet light irradiation to the predetermined region with the predetermined pattern and heat-treating comprises:
    applying ultraviolet light irradiation to the predetermined area with the predetermined pattern; and
    heat-treating the coating to remove a solvent, so as to form the plurality of second portions.

18. The method according to claim 16, wherein applying ultraviolet light irradiation to the predetermined region with the predetermined pattern and heat-treating comprises:
    applying ultraviolet light irradiation to the predetermined area with the predetermined pattern and at the same time, heat-treating the coating to remove a solvent, so as to form the plurality of second portions.

19. The method according to claim 16, wherein the polymer crosslinked and cured by ultraviolet light is one or more of polycarbonate and polymethyl methacrylate.

20. The method according to claim 16, wherein the predetermined pattern is at least one pattern of a polygon, a circle, and an ellipse.

* * * * *